United States Patent
Loney et al.

(10) Patent No.: US 10,629,535 B2
(45) Date of Patent: *Apr. 21, 2020

(54) THERMALLY ISOLATED GROUND PLANES WITH A SUPERCONDUCTING ELECTRICAL COUPLER

(71) Applicant: NORTHROP GRUMMAN SYSTEMS CORPORATION, Falls Church, VA (US)

(72) Inventors: Patrick Alan Loney, Fairview Park, OH (US); Aaron Ashley Hathaway, Baltimore, MD (US); Daniel Robert Queen, Kensington, MD (US); John X. Przybysz, Severna Park, MD (US); Robert Miles Young, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/798,977

(22) Filed: Oct. 31, 2017

(65) Prior Publication Data

US 2019/0131246 A1    May 2, 2019

(51) Int. Cl.
*H01L 23/532* (2006.01)
*H01L 27/18* (2006.01)
(Continued)

(52) U.S. Cl.
CPC ......... *H01L 23/53285* (2013.01); *H01F 6/06* (2013.01); *H01L 23/34* (2013.01);
(Continued)

(58) Field of Classification Search
CPC ......... H01L 23/34–4735; H01L 31/024; H01L 31/052–0525; H01L 33/64–648;
(Continued)

(56) References Cited

U.S. PATENT DOCUMENTS 3,346,351 A * 10/1967 Flashman ............... B23K 35/26
                                                      174/15.4
4,554,567 A    11/1985 Jillie et al.
(Continued)

FOREIGN PATENT DOCUMENTS

EP    0883178 A2    12/1998
WO    2011109595    9/2011

OTHER PUBLICATIONS

International Search Report and Written Opinion corresponding to International App. No. PCT/US2018/048590 dated Nov. 28, 2018.
(Continued)

*Primary Examiner* — Jose R Diaz
(74) *Attorney, Agent, or Firm* — Tarolli, Sundheim, Covell & Tummino LLP (57) ABSTRACT

An integrated circuit is provided that comprises a first ground plane associated with a first set of circuits that have a first operational temperature requirement, and a second ground plane associated with a second set of circuits that have a second operational temperature requirement that is higher than the first operational temperature requirement. The second ground plane is substantially thermally isolated from the first ground plane. A superconducting coupler electrically couples the first ground plane and the second ground plane while maintaining relative thermal isolation between the first ground plane and the second ground plane.

19 Claims, 5 Drawing Sheets

(51) Int. Cl.

| | |
|---|---|
| *H01L 23/528* | (2006.01) |
| *H01L 23/522* | (2006.01) |
| *H01L 23/367* | (2006.01) |
| *H01L 49/02* | (2006.01) |
| *H01F 6/06* | (2006.01) |
| *H01L 23/66* | (2006.01) |
| *H01L 23/34* | (2006.01) |
| *H01L 23/498* | (2006.01) |
| *H01L 23/538* | (2006.01) |
| *H01L 23/373* | (2006.01) |

(52) U.S. Cl.
CPC ........ *H01L 23/367* (2013.01); *H01L 23/5226* (2013.01); *H01L 23/5227* (2013.01); *H01L 23/5286* (2013.01); *H01L 23/66* (2013.01); *H01L 27/18* (2013.01); *H01L 28/10* (2013.01); *H01L 23/373* (2013.01); *H01L 23/49888* (2013.01); *H01L 23/5383* (2013.01); *H01L 2223/6605* (2013.01); *H01L 2223/6683* (2013.01)

(58) Field of Classification Search
CPC ....... H01L 21/4871–4882; H01L 23/36–3738; H01L 23/40–4093; H01L 23/42–4338; H01L 39/04; H01L 39/045; H01L 23/53285; H01L 27/18
See application file for complete search history.

(56) References Cited

U.S. PATENT DOCUMENTS

| | | | |
|---|---|---|---|
| 10,229,864 B1* | 3/2019 | Loney | .................... H01L 27/18 |
| 2005/0254215 A1 | 11/2005 | Khbeis et al. | |
| 2009/0102580 A1 | 4/2009 | Uchaykin | |
| 2010/0328913 A1 | 12/2010 | Kugler et al. | |
| 2011/0215457 A1 | 9/2011 | Park | |
| 2011/0290537 A1 | 12/2011 | Nagase | |
| 2017/0077069 A1 | 3/2017 | Danno et al. | |
| 2018/0102470 A1* | 4/2018 | Das | ...................... H01L 39/025 |
| 2019/0116670 A1 | 4/2019 | Anderson et al. | |
| 2019/0131246 A1 | 5/2019 | Loney et al. | |

OTHER PUBLICATIONS

International Search Report corresponding to PCT/US2018/050921, dated Dec. 7, 2018.
Ramos, R.C. et al. (2001). "Design for Effective Thermalizatoin of Junctions for Quantum Coherence," IEEE Transactions on Applied Superconductivity,IEEE Service Center, Los Alamitos, CA, US, vol. 11, No. 1, p. 998-1001, Mar. 2001.
Wellstood, F.C. et al. (1989). "Hot Electron Effect in the dc Squid", IEEE Transactions on Magnetics, vol. 25, No. 2, pp. 1001-1004, Jan. 1, 1989.
International Search Report and Written Opinion corresponding to International Application No. PCT/US2018/045184 dated Dec. 17, 2018.
Non Final Office Action for U.S. Appl. No. 16/241,629 dated Feb. 18, 2020.

* cited by examiner

THERMALLY ISOLATED GROUND PLANES WITH A SUPERCONDUCTING ELECTRICAL COUPLER

GOVERNMENT INTEREST

The invention was made under Government Contract Number 30078178. Therefore, the US Government has rights to the invention as specified in that contract.

TECHNICAL FIELD

The present invention relates generally to integrated circuits, and more particularly to thermally isolated ground planes with a superconducting electrical coupler.

BACKGROUND

Monolithic Microwave Integrated circuit (MMIC) chips operating at cryogenic temperatures have superconducting circuits that need to be thermally managed. One primary method is to remove the heat from the superconducting circuits down towards the substrate. Ground planes made of metal mesh material in lower level layers in the MMIC bring the entire layers to a thermal equilibrium. Because of this, portions of devices on the MMIC that need to be maintained at lower temperatures end up becoming exposed to higher temperature components.

At the cryogenic conditions, heat load, cooling resources, temperature, and circuit complexity are strongly tied to each other. The savings of one unit of power dissipation is magnified by multiple orders of magnitude when lifting from cryogenic temperatures to room temperature. As cryogenic chips become more and more complex, a greater number and greater variation of devices are populating the MMICs. Each of these devices can have different operational temperature requirements.

A typical cryogenic MMIC consists of a silicon substrate topped with alternating layers of electrically conducting material and dielectric. Multiple device types can exist in the MMIC. As an example, a MMIC may have three different device types that need to run at three different operating temperatures: The first device needs to operate below 500 mK (milliKelvin), the second device needs to operate below 1 K (Kelvin), and the third device needs to operate below 4 K. With a single ground plane, the entire mesh layer will be at a near uniform temperature. This is due to the ability of the electrically conducting material to transport (spread) the heat laterally in the X and Y directions. Therefore, if all devices are connected to this ground plane, all will have to be maintained to the most stringent operating requirement, for example, 500 mK. That is since the third device only needs to be kept at 4 K, but is instead maintained at 0.5 K, then 8 times the cooling resources are needed to manage this sector of the MMIC.

SUMMARY

In one example, an integrated circuit is provided that comprises a first ground plane associated with a first set of circuits that have a first operational temperature requirement, and a second ground plane associated with a second set of circuits that have a second operational temperature requirement that is higher than the first operational temperature requirement. The second ground plane is substantially thermally isolated from the first ground plane. A superconducting coupler electrically couples the first ground plane and the second ground plane while maintaining relative thermal isolation between the first ground plane and the second ground plane.

In another example, a monolithic microwave integrated circuit (MMIC) is provided that comprises a thermal sink layer underlying a substrate, a first superconducting ground plane associated with a first set of superconducting circuits that have a first operational temperature requirement, and a first set of thermally conductive vias that each couple the first electrically conducting ground plane to the thermal sink layer through the substrate.

The MMIC also comprises a second superconducting ground plane associated with a second set of superconducting circuits that have a second operational temperature requirement that is higher than the first operational temperature requirement, and a second set of thermally conductive vias that each couple the second ground plane to the thermal sink layer through the substrate, wherein the first set of thermally conductive vias have a greater volume of thermal conductive material than the second set of thermally conductive vias, and a superconducting coupler that electrically couples the first superconducting ground plane to the second superconducting ground plane while maintaining relative thermal isolation between the first superconducting ground plane and the second superconducting ground plane.

DETAILED DESCRIPTION

The present disclosure describes an integrated circuit (e.g., Monolithic Microwave Integrated circuit (MMIC)) that includes separate dedicated ground planes for sets of circuits that run at different operating temperature requirements. A set as used herein refers to one or more of a given structure (e.g., superconducting couplers, thermal vias, and superconducting circuits). The separate dedicated ground planes are electrically coupled to one another by a set of superconducting electrical couplers. The set of superconducting electrical couplers provide good electrical connections between the separate dedicated ground planes (and active circuits), while maintaining thermal isolation between the separate dedicated ground planes. A superconducting material is a good electrically conductive material but a poor thermal conductive material (compared to a normal metal).

In one example, an engineered amount of superconducting material can be determined to form the superconducting coupler to connect separate superconducting Thermal Ground Planes (TGP). Thermal isolation is maintained and electrical connection is provided. Signals on MMIC superconducting ground planes operate at high frequencies (10 to 40 GHz are typical). If these planes are split to provide separate thermal/temperature zones, the planes will act like antennas and radiate unwanted RF energy. Additionally, various signals need to be passed between the split planes. Electrically connecting the split planes is thus required. However, it is necessary to maintain very strong thermal isolation between the planes. By utilizing an engineered amount of superconductor, the thermal and electrical requirements can both be satisfied.

Each separate ground plane can be coupled to a thermal sink layer at the bottom side of a substrate by respective sets of thermal vias (contacts). The thermal sink layer can be cooled appropriately to allow for adequate heat sinking from each of the separate ground planes to maintain the respective sets of circuits at their desired operating temperature requirements. The thermal sink layer and the thermal vias can be formed of a normal metal that has a high thermal conductivity. A normal metal has a high thermal conductivity and never transitions into a superconductor. Examples of a normal metal include copper, gold and silver, but may also include a number of other normal metals.

The thermal vias can be sized differently or have a different number of similarly sized thermal vias based on the different operating temperature requirements of ground planes and the heat loads generated by their associated circuitry to provide adequate cooling of each ground plane. For equal heat loads on each ground plane, the amount of thermal conductive material of the thermal vias that couple a given ground plane to the thermal sink layer is greater than the amount of thermal conductive material of the thermal vias that couple a ground plane associated with circuits that have higher operating temperature requirements, and smaller than the amount of thermal conductive material of the thermal vias that couple a ground plane associated with circuits that have lower operating temperature requirements. This provides for proportional thermal sink capacity based on circuits having different operating temperature requirements.

The one or more superconducting couplers provide good electrical connections of the separate dedicated ground planes without effecting the different operating temperature requirements of the separate dedicated ground planes.

The present examples will be illustrated with respect to electrically conducting ground planes and associated superconducting circuits with different operational temperature requirements. However, other examples can include mixtures of superconducting ground planes and associated superconducting circuitry and non-superconducting ground planes and associated superconducting circuitry, or a mixture of non-superconducting ground planes and associated non-superconducting circuitry with different operational temperature requirements.

Figure 1:
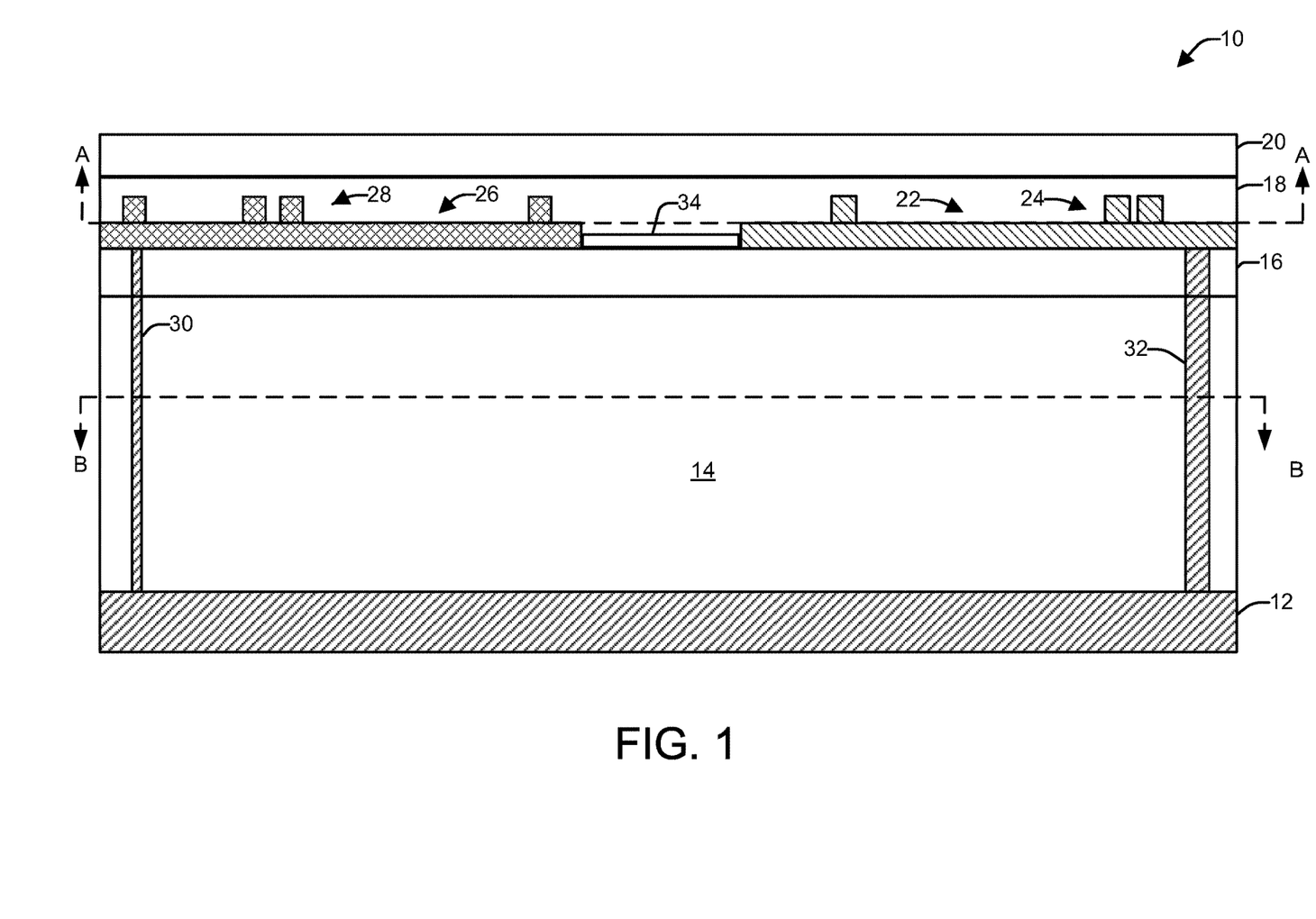
FIG. 1 illustrates cross-sectional view of a portion of an example integrated circuit.
Figure 2:
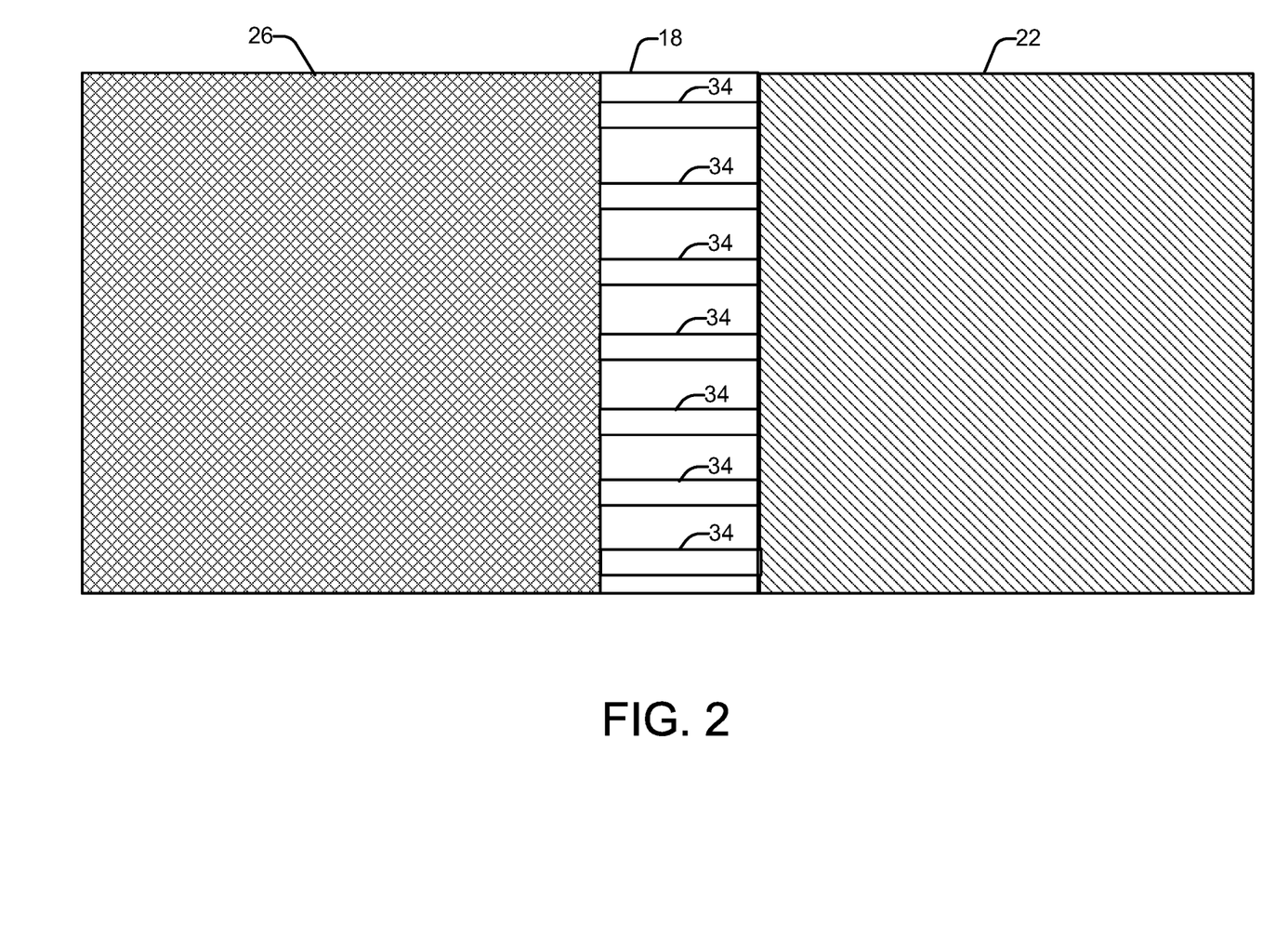
FIG. 2 illustrates a top plan view of the integrated circuit of FIG. 1 cut away along lines A-A.

FIG. 1 illustrates cross-sectional view of portion of an example integrated circuit 10. FIG. 2 illustrates a top plan view of the integrated circuit 10 cut away along lines A-A. The portion of the integrated circuit 10 includes a first dielectric layer 16 overlying a substrate 14, a second dielectric layer 18 overlying the first dielectric layer 16, and a third dielectric layer 20 overlying the second dielectric layer 18. The substrate 14 can be formed of silicon, glass or other substrate material. A thermal sink layer 12 resides at a bottom of the substrate 14. The first dielectric layer 16 provides a buffer layer between the substrate and the active circuits of the integrated circuit 10. A first electrically conducting ground plane 22 and a first set of superconducting circuits 24 are disposed in the second dielectric layer 18, and a second electrically conducting ground plane 26 and a second set of superconducting circuits 28 resides in the second dielectric layer 18. The first electrically conducting ground plane 22 and the first set of superconducting circuits 24 have a first operating temperature requirement and the second electrically conducting ground plane 26 and the second set of superconducting circuits 28 have a second operating temperature requirement, such that proper operation of the respective superconducting circuit is maintained as long as the respective superconducting circuit is maintained at or below the respective operating temperature requirement.

The term operating temperature requirement refers to an operating temperature that a circuit material of a ground plane and/or set of circuits needs to operate at or below to maintain their properties. For example, the first electrically conducting ground plane 22 and the first set of superconducting circuits 24 may include the utilization of Aluminum, which needs to maintain an operating temperature of at or below 500 milliKelvin to superconduct, while the second electrically conducting ground plane 26 and the second set of superconducting circuits 28 may include the utilization of Niobium, which needs to maintain an operating temperature of at or below 4 Kelvin to superconduct. That means a set of circuits with a lower operating temperature requirement needs more cooling resources than a set of circuits with a higher operating temperature requirement.

One or more superconducting electrical couplers 34 electrically couple the first ground plane 22 to the second ground plane 26. As previously stated, a superconductor is a very good electrical conductor but a poor thermal conductor such that a good electrical coupling is provided between the first ground plane 22 and the second ground plane 26, while also maintaining good temperature isolation between the first and second ground planes, and thus the first set of superconducting circuits 24 and the second set of superconducting circuits 28.

The amount of superconducting material between the two planes is determined by the electrical and thermal requirements of the integrated circuit 10. Since the material is superconducting, it is capable of passing a large amount of current with a small amount of material. The minimum amount can be determined by comparing the expected duty/current and balancing that against the maximum allowable current density allowed by the material (and still maintaining superconducting capability). This sets the floor for the minimal amount. Thermally, analyses can determine the amount of heat leak allowed between the two planes. Taking into account the phonon conduction heat leak through the dielectric materials by the thermal ground plane connector. This sets the ceiling for the maximum amount of material. As long as there is a positive envelope between the minimum and maximum amounts of material, there exists a design solution. Taking into consideration a superconductor's ability to carry current and inability to carry heat, the likelihood of a positive envelope existing is high.

Referring again to FIGS. 1-2, a first thermal via 32 connects the first electrically conducting ground plane 22 to the thermal sink layer 12, and a second thermal via 30 connects the second electrically conducting ground plane 28 to the thermal sink layer 12 both through the substrate 14. The thermal sink layer 12 is formed of a thermal conductive material. A thermal conductive material is a material that is a relatively good thermal conductor, such that it readily transfers heat. A superconductive material is a good electrically conductive material but a poor thermal conductive material (compared to a normal metal that is not superconducting). Therefore, the thermal sink layer 12 is not formed of a superconductive material. Additionally, the first thermal via 32 and the second thermal via 30 can be formed of a thermal conductive material. That is a material that is relatively good at conducting heat from the electrically conducting ground layers to the thermal sink layer 12. The thermal sink layer 12 can be cooled by an external source. In one example, the thermal sink layer 12, the first thermal via 32 and the second thermal via 30 are all formed of copper.

As illustrated in FIG. 1, the thickness and as a result the volume of thermally conductive material associated with the first thermal via 32 is greater than the thickness and as a result the volume of thermally conductive material associated with the second thermal via 30. Therefore, heat is removed from the first electrically conducting ground plane 22 and first set of superconducting circuits 24 with less gradient than present in the second electrically conducting ground plane 26 and the second set of superconducting circuits 28. This allows for providing a single cooling layer for cooling ground planes with different operating temperature requirements.

Therefore, the temperature of the first electrically conducting ground plane 22 and the first set of superconducting circuits 24 can be maintained at a lower temperature than the second electrically conducting ground plane 26 and the second set of superconducting circuits 30 by using the same thermal sink layer 12. The thermal sink layer 12 can be cooled to a temperature that can be higher than the first operating temperature requirement but still maintain the first electrically conducting ground plane 22 and the first set of superconducting circuits 24 at the first operating temperature requirement, and the second electrically conducting ground plane 26 and the second set of superconducting circuits 28 at the second operating temperature requirement.

Although FIG. 1 illustrates a single first thermal via and a single second thermal via, there can be a greater number of first thermal vias and second thermal vias as long as the proportional volume of thermal conductive material of the first thermal vias relative to the second thermal vias are maintained to keep the temperature of the first electrically conducting ground plane 22 and the first set of superconducting circuits 24 at or below the first operating temperature requirement, and the second electrically conducting ground plane 26 and the second set of superconducting circuits 28 at or below the second operating temperature requirement, respectively.

Figure 3:
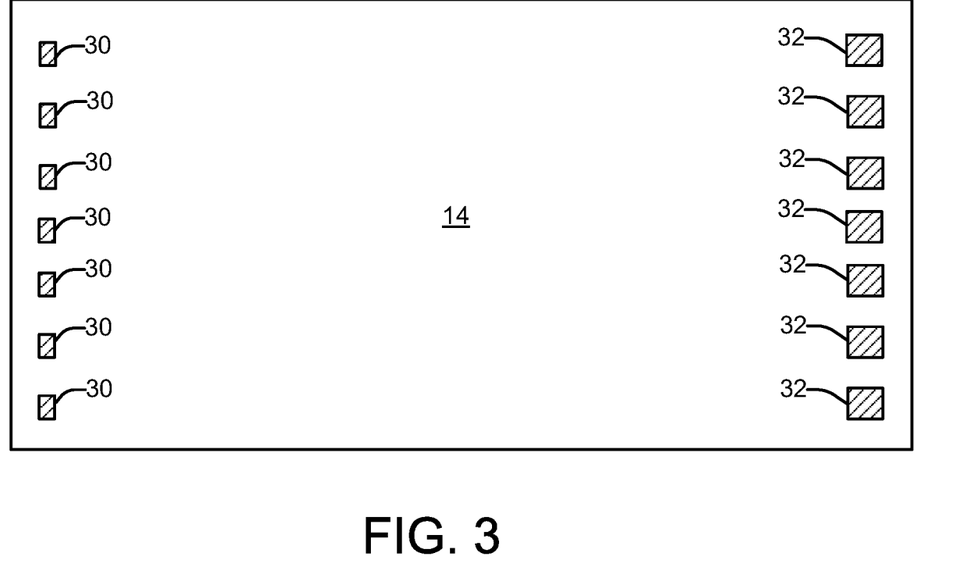
FIG. 3 illustrates a cross-sectional view of the portion of the integrated circuit of FIG. 1 along the lines B-B assuming multiple first vias and multiple second vias.

FIG. 3 illustrates a cross-sectional view of the portion of the integrated circuit 10 along the lines B-B assuming multiple first vias and second vias. As illustrated in FIG. 1-3, the thickness and as a result the volume of thermally conductive material associated with the first set of thermal vias 32 is greater, proportional to the head loads, than the thickness and as a result the volume of thermally conductive material associated with the second set of thermal vias 30. Therefore, the heat transferred and removed from the first electrically conducting ground plane 22 and the first set of superconducting circuits 24 is done with less gradient than the heat transferred and removed from second electrically conducting ground plane 26 and the second set of superconducting circuits 28.

Figure 4:
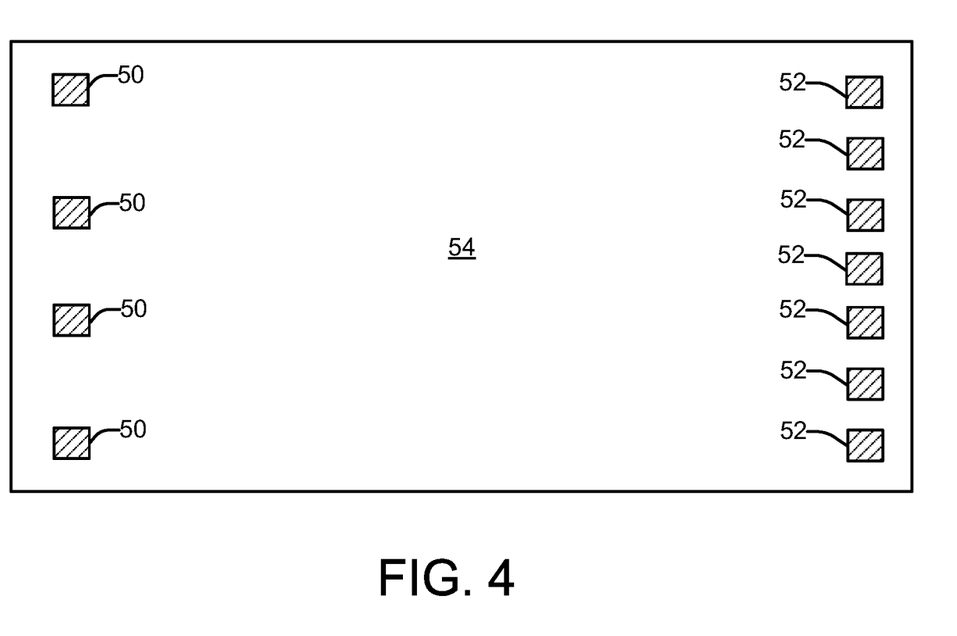
FIG. 4 illustrates another example of a cross-sectional view of a possible portion of a similar integrated circuit as that illustrated in FIG. 3.

It is to be appreciated that in the example of FIG. 3 there is a one-to-one correspondence between vias in the first set of thermal vias 32 and the second set of thermal vias 30. FIG. 4 illustrates another example of a cross-sectional view of a possible portion of a similar integrated circuit as that illustrated in FIG. 3. In this example, each of the thermal vias of a first set of thermal vias 52 and a second set of thermal vias 50 have substantially the same depth and width and as a result have substantially the same volume. However, the number of thermal vias in the first set of thermal vias 52 is greater than the number of thermal vias in the second set of thermal vias 50. As a result the volume of thermally conductive material in the first set of thermal vias 52 is greater than the volume of thermally conductive material in the second set of thermal vias 50. Therefore, greater cooling is provided to the first electrically conducting ground plane 22 and first set of superconducting circuits 24 relative to the second electrically conducting ground plane 26 and the second set of superconducting circuits 28 due to the extra thermally conductive material in the first set of vias 52 relative to the second set of vias 50.

Figure 5:
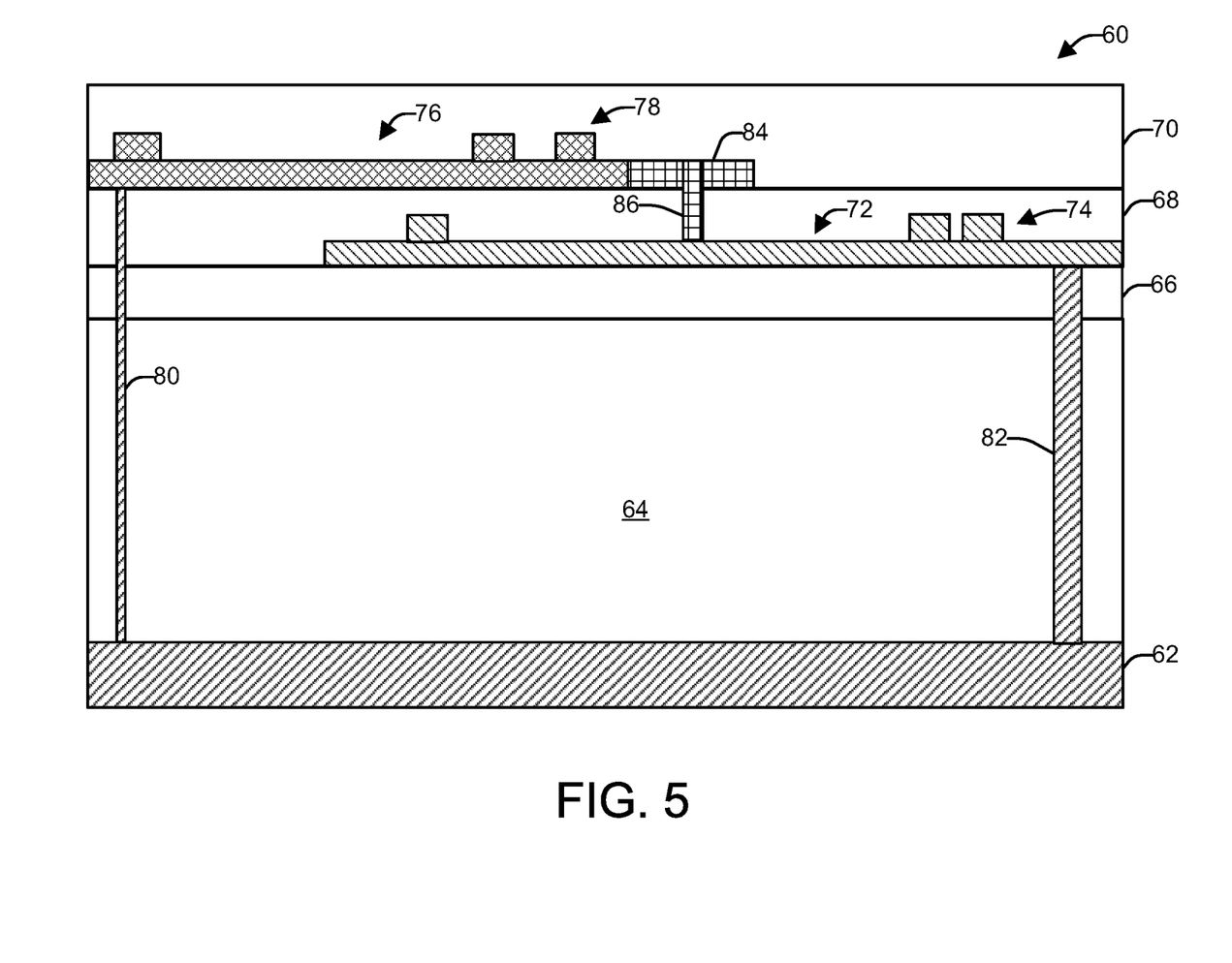
FIG. 5 illustrates a cross-sectional view of a portion of yet another example of an integrated circuit.

FIG. 5 illustrates a cross-sectional view of a portion of yet another example of an integrated circuit 60. The portion of the integrated circuit 60 includes a first dielectric layer 66 overlying a substrate 64, a second dielectric layer 68 overlying the first dielectric layer 66, and a third dielectric layer 70 overlying the second dielectric layer 68. The substrate 64 can be formed of silicon, glass or other substrate material. A thermal sink layer 62 resides at a bottom of the substrate 64. The first dielectric layer 66 provides a buffer layer between the substrate 64 and the active circuits of the integrated circuit 60. A first electrically conducting ground plane 72 and a first set of superconducting circuits 74 are disposed in the second dielectric layer 68, and a second electrically conducting ground plane 76 and a second set of superconducting circuits 78 resides in the third dielectric layer 70. The first electrically conducting ground plane 72 and the first set of superconducting circuits 74 have a first operating temperature requirement and the second electrically conducting ground plane 76 and the second set of superconducting circuits 78 have a second operating temperature requirement.

A first set of thermals via 82 connect the first electrically conducting ground plane 72 to the thermal sink layer 62, and a second second set of thermal vias 80 connect the second electrically conducting ground plane 76 to the thermal sink layer 62 both through the substrate 64. The size and/or the number of vias in the first set of thermal vias 82 is greater than the size and/or number of vias in the second set of thermal vias 80. The thermal sink layer 62, the first set of thermal vias 82 and the second set of thermal vias 80 can be formed of a thermally conductive material. That is a material that is relatively good at conducting heat from the electrically conducting ground layers to the thermal sink layer 62. The thermal sink layer 62 can be cooled by an external source. In one example, the thermal sink layer 62, the first set of thermal vias 82 and the second set of thermal vias 80 are all formed of copper. In this example, ground plane 76 has a larger gradient and requires fewer vias of a same similar size or thinner vias than ground plane 72 to maintain its higher operating temperature requirement. Ground plane 72 has a smaller gradient and requires more vias of a same similar size or larger volume vias than ground plane 76 to maintain its lower operating temperature requirement.

A spiral superconducting electrical coupler 84 resides adjacent and coupled to the second electrically conducting ground plane 76 in the third dielectric layer 70. A superconducting via 86 extends from the center of the spiral superconducting electrical coupler 84 to the first electrically conducting ground plane 72 to provide electrical coupling between the second electrically conducting ground plane 76 to the first electrically conducting ground plane 72 while maintaining thermal isolation between the two ground planes. The spiral superconducting electrical coupler 84 forms an RF inductive choke that allows good electrical DC coupling between the first electrically conducting ground plane 72 and second electrically conducting ground plane 76 but block frequencies from transferring between the first set of superconducting circuits 74 and the second set of superconducting circuits 78. The present example illustrates a spiral structure to form the RF inductive choke, but other shapes and/or structures can also be employed to form an RF inductive choke.

Figure 6:
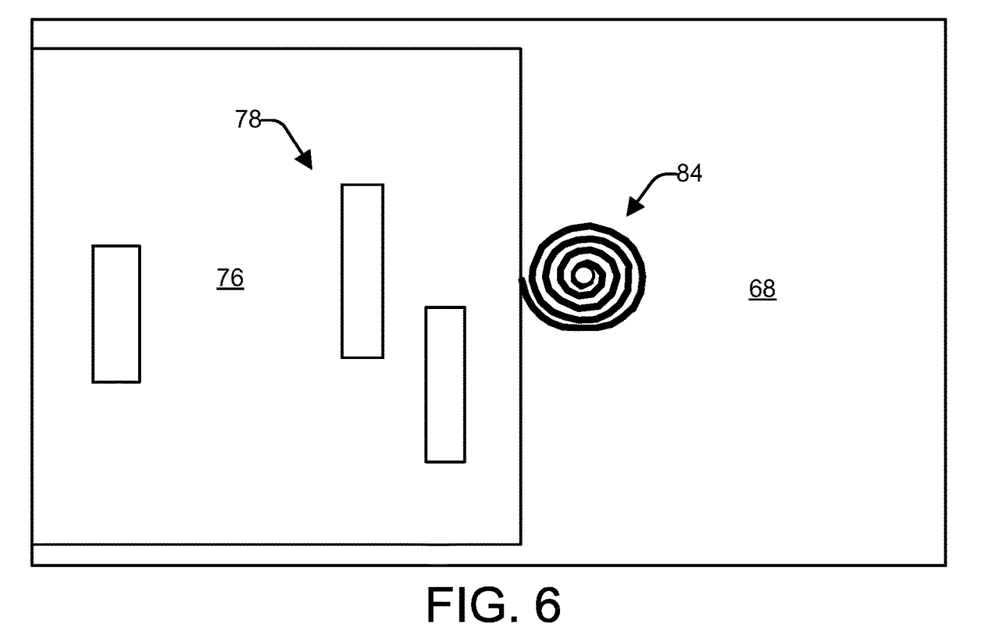
FIG. 6 illustrates a plan view of the second electrically conducting ground plane, the second set of superconducting circuits and the spiral superconducting electrical Radio Frequency (RF) choke coupler adjacent the second electrically conducting ground plane with the third dielectric layer removed.
Figure 7:
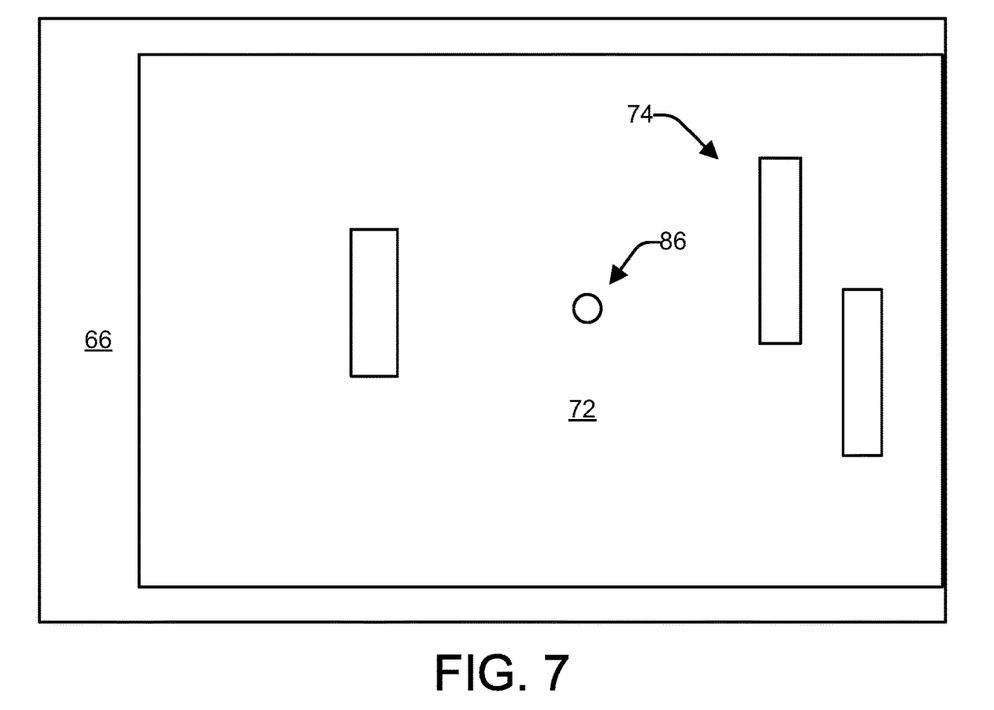
FIG. 7 illustrates a plan view of the first electrically conducting ground plane, the first set of superconducting circuits and the superconducting via coupled to the first electrically conducting ground plane with the second dielectric layer and the third dielectric layer and associated components removed.

FIG. 6 illustrates a plan view of the second electrically conducting ground plane 76, the second set of superconducting circuits 78 and the spiral superconducting electrical coupler 84 adjacent the second electrically conducting ground plane 76 with the third dielectric layer 70 removed. FIG. 7 illustrates a plan view of the first electrically conducting ground plane 72, the first set of superconducting circuits 74 and the superconducting via 86 coupled to the electrically conducting ground plane 72 with the second dielectric layer 68 and the third dielectric layer 70 and associated components removed.

Two examples are given below to illustrate the impacts on heat dissipation on the integrated circuit 60 of FIGS. 5-7. In the first example, a conductor 10 µm long with an area of 1×0.2 µm$^2$ is analyzed. In this example the hot side is 4 K and the cold side is 1 K. For a normal metal gold conductor the thermal resistance (Theta, or $\Theta$) is $4.90\times10^4$ K/W. If the gold is replaced with superconducting niobium, $\Theta$ becomes $2.7\times10^5$ K/W. In the second example, the length of the conductor is now 100 µm. All other parameters remain the same as in the first example. For a normal metal gold conductor the thermal resistance (Theta, or $\Theta$) is $4.9\times10^5$ W/K. If the gold is replaced with superconducting niobium, $\Theta$ becomes $2.7\times10^6$ W/K.

As can be seen in both examples, there is a factor of 6× difference in $\Theta$. This will correspond to a decrease in heat transport in a configuration utilizing the superconducting metal when compared to a similar normal metal. Further reduction in heat transport can be realized by an even thinner cross section of the superconducting conductor. This can be done since the superconducting material can carry significantly more current (on an area basis) when compared to a normal metal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An integrated circuit comprising:
    a first ground plane associated with a first set of circuits that have a first operational temperature requirement;
    a second ground plane associated with a second set of circuits that have a second operational temperature requirement that is higher than the first operational temperature requirement, the second ground plane being substantially thermally isolated from the first ground plane;
    a superconducting coupler that electrically couples the first ground plane and the second ground plane while maintaining relative thermal isolation between the first ground plane and the second ground plane;
    a thermal sink layer;
    a first thermally conductive via that couples the first ground plane to the thermal sink layer; and
    a second thermally conductive via that couples the second ground plane to the thermal sink layer,
    wherein the first thermally conductive via has an appropriate volume proportional to the heat loads of thermal conductive material than the second thermally conductive via to remove heat from the first set of circuits with less gradient than the second set of circuits.

2. The circuit of claim 1, wherein the superconducting coupler comprises one or more superconducting connecting lines that each couple the first ground plane to the second ground plane.

3. The circuit of claim 1, wherein the superconducting coupler comprises an RF inductive choke that allows good electrical DC coupling but block frequencies from transferring between the first set of circuits and the second set of circuits.

4. The circuit of claim 1, wherein the thermal sink layer, the first thermally conductive via and the second thermally conductive via are formed of a normal metal without superconducting properties.

5. The circuit of claim 1, wherein the first ground plane and the first set of circuits are formed of a first superconducting material, and the second ground plane and the second set of circuits are formed of a second superconducting material that has a different operating temperature requirement than the first superconducting material.

6. The circuit of claim 5, wherein the first superconducting material is formed from Aluminum, and the second superconducting material is formed of Niobium.

7. The circuit of claim 1, wherein the first ground plane and the first set of circuits reside in a first dielectric layer overlying a substrate, and the second ground plane and the second set of circuits resides in a second dielectric layer overlying the substrate and one of overlying and underlying the first dielectric layer.

8. The circuit of claim 1, wherein the first ground plane and the first set of circuits resides in a first dielectric layer overlying a substrate, and the second ground plane and the second set of circuits resides in the first dielectric layer adjacent and physically separated and thermally isolated from the first ground plane and the first set of circuits.

9. The circuit of claim 1, wherein the first thermally conductive via is one of a plurality of first thermally conductive vias that each couple the first ground plane to the thermal sink layer through a substrate, and the second thermally conductive via is one of a plurality of second thermally conductive vias that each couple the second ground plane to the thermal sink layer through the substrate.

10. The circuit of claim 9, wherein each of the first thermally conductive vias have a first size and each of the second thermally conductive vias have an equal number of thermally conductive vias of a second size, the first size being sized larger by volume proportional to the heat loads than the second size to remove heat from the first set of circuits with less gradient than the second set of circuits.

11. The circuit of claim 10, wherein each of the first thermally conductive vias and each of the second thermally conductive vias are substantially the same size, wherein the number of the plurality of first thermally conductive vias is greater than the number of the plurality of second thermally conductive vias to remove heat from the first set of circuits with less gradient than the second set of circuits.

12. A monolithic microwave integrated circuit (MMIC) comprising:
- a thermal sink layer underlying a substrate;
- a first superconducting ground plane associated with a first set of superconducting circuits that have a first operational temperature requirement;
- a first set of thermally conductive vias that each couple the first superconducting ground plane to the thermal sink layer through the substrate;
- a second superconducting ground plane associated with a second set of superconducting circuits that have a second operational temperature requirement that is higher than the first operational temperature requirement;
- a second set of thermally conductive vias that each couple the second superconducting ground plane to the thermal sink layer through the substrate, wherein the first set of thermally conductive vias have a greater volume of thermal conductive material than the second set of thermally conductive vias; and
- a superconducting coupler that electrically couples the first superconducting ground plane and the second superconducting ground plane while maintaining relative thermal isolation between the first superconducting ground plane and the second superconducting ground plane.

13. The circuit of claim 12, wherein the superconducting coupler comprises one or more superconducting connecting lines that each couple the first superconducting ground plane to the second superconducting ground plane.

14. The circuit of claim 12, wherein the superconducting coupler comprises an RF inductive choke that allows good electrical DC coupling but block frequencies from transferring between the first set of superconducting circuits and the second set of superconducting circuits.

15. The circuit of claim 12, wherein the thermal sink layer, the first thermally conductive via and the second thermally conductive via are formed of a non-superconducting metal that has high thermal conductivity and the first electrically superconducting ground plane is formed from Aluminum, and the second superconducting ground plane is formed of Niobium.

16. The circuit of claim 12, wherein the first superconducting ground plane and the first set of superconducting circuits reside in a first dielectric layer overlying the substrate, and the second superconducting ground plane and the second set of superconducting circuits resides in a second dielectric layer overlying the substrate and one of overlying and underlying the first dielectric layer.

17. The circuit of claim 12, wherein the first superconducting ground plane and the first set of superconducting circuits resides in a first dielectric layer overlying the substrate, and the second superconducting ground plane and the second set of superconducting circuits resides in the first dielectric layer adjacent and physically separated from the first ground plane and the first set of superconducting circuits.

18. The circuit of claim 12, wherein each thermally conductive via of the first set of thermally conductive vias have a first size and each thermally conductive via of the second set of thermally conductive vias have an equal number of thermally conductive vias of a second size, the first size being sized larger by volume than the second size to remove heat proportional to the heat loads from the first set of superconducting circuits with less gradient than the second set of superconducting circuits.

19. The circuit of claim 12, wherein each thermally conductive via of the first set of thermally conductive vias and each thermally conductive via of the second set of thermally conductive vias are substantially the same size, wherein the number of the thermally conductive vias of the first set of thermally conductive vias is greater than the number of the thermally conductive vias of the second set of second thermally conductive vias proportional to the heat loads to remove heat from the first set of superconducting circuits with less gradient than the second set of superconducting circuits.

* * * * *